United States Patent [19]

Lovejoy

[11] Patent Number: 5,046,101
[45] Date of Patent: Sep. 3, 1991

[54] AUDIO DOSAGE CONTROL SYSTEM
[75] Inventor: Kim A. Lovejoy, Waukesha, Wis.
[73] Assignee: Lovejoy Controls Corp., Waukesha, Wis.
[21] Appl. No.: 436,207
[22] Filed: Nov. 14, 1989
[51] Int. Cl.[5] ............................................. H03G 3/20
[52] U.S. Cl. ..................................... 381/57; 381/72; 381/108
[58] Field of Search .................. 381/98, 103, 108, 57, 381/72, 82, 83, 93, 104

[56] References Cited

U.S. PATENT DOCUMENTS

| | | |
|---|---|---|
| 2,338,551 | 1/1944 | Stanko . |
| 2,468,205 | 4/1949 | Kellogg . |
| 2,616,971 | 11/1952 | Kannenberg . |
| 3,009,991 | 11/1961 | Bekey . |
| 4,254,303 | 3/1981 | Takizawa . |
| 4,306,115 | 12/1981 | Humphrey . |
| 4,458,362 | 7/1984 | Berkovitz et al. ................ 381/103 |
| 4,583,245 | 4/1986 | Gelow et al. . |
| 4,602,337 | 7/1986 | Cox .................................... 381/83 |
| 4,628,530 | 12/1986 | Op De Beek et al. ............ 381/103 |
| 4,888,808 | 12/1989 | Ishikawa et al. .................. 333/28 T |

Primary Examiner—Forester W. Isen
Attorney, Agent, or Firm—Fuller, Ryan & Hohenfeldt

[57] ABSTRACT

Microphones sample the sound output from the speakers of a sound amplification system. The resulting time domain analog signals undergo a Fast Fourier Transform which yields frequency domain signals representative of the intensities of the frequency bands which compose the sound. The intensities or levels of each band are compared to stored permissible level limits for each frequency band. Attenuators respond to signals indicative of band levels being exceeded by respectively attenuating the frequency bands to which they are tuned so the speaker output does not contain frequencies which exceed permissible limits. The time weighted permissible averages for each frequency are also integrated to provide for production of signals representative of the cumulative sound dosage. When total dosage is trending toward exceeding permissible limits for the time during which the listeners are expected to be listening, the cumulative dose signals operate another attenuator to cause the volume emitted by the speaker to drop to a permissible level.

23 Claims, 4 Drawing Sheets

AUDIO DOSAGE CONTROL SYSTEM

BACKGROUND OF THE INVENTION

The invention disclosed herein is an audio amplification system which features protection against damage to the hearing of persons who might otherwise be exposed to sound levels in excess of acceptable levels.

It is common practice at indoor or outdoor music concerts for the performers to use a sound amplification system which drives speakers at sound output levels which can damage the hearing of the listeners. The health authorities of governments have set up noise level limitation standards whose purpose it is to preserve the hearing integrity of employees. The Occupational Safety and Health Administration (OSHA) of the United States Government, the American National Standard Institute (ANSI) and the International Standards Organization (ISO) have established standards for protection of employees against the effects of noise exposure. The OSHA standards are published in 29 C.F.R. 1910.95. Basically, the standards provide for an inverse relationship between the number of hours of exposure to the noise per day and the level of the noise or sound in terms of decibels. For example, the safe limit for an employee exposed to sound levels at 95 decibels is 4 hours whereas if the sound level is at 110 decibels the limit of exposure is ½ hour. The standards also recognize that it is not only the total sound energy or level which must be taken into consideration but also the frequency content of the sound or noise. Generally, sounds in the higher frequency part of the audible frequency range are more energetic and can cause greater damage at a given decibel level than sounds at much lower frequencies. For example, a very high decibel level is permissible for sounds near the lower frequency part of the audible range such as around 20 Hz whereas a much lower decibel level is permissible for sound having the same energy content at a higher frequency such as 4000 Hz or above. It is known that sound levels in the higher frequency parts of the spectrum which often occur at so called rock music concerts cause permanent damage to the hearing of listeners. It is also well known that the cumulative sound dose at many concerts exceeds the permissible limits for total dosage set by the various standards.

Besides taking measures to protect the hearing of members of the audience who have paid an admission fee for listening to a concert there must be concern about the possible damage to the hearing of employees such as the musicians, audio amplifier operators and those who are compelled to attend the concert such as officials who are there to prevent unlawful and disorderly conduct. Audio dosimeters attached to employees who are exposed to whatever sound is emitted by the speakers have demonstrated huge overdoses of sound during a concert. It has been discovered that the persons who regularly operate the amplification equipment at concerts have suffered severe hearing loss without appreciating it. Since their hearing is subnormal they have a tendency to turn up the gain of the amplifiers to a level which they think is tolerable because of their hearing deficiency but which will result in the onset of permanent hearing damage to the listeners.

There are known systems for achieving automatic volume control for the output volume from a set of loudspeakers. Examples are given in U.S. Pat. Nos. 2,338,551; 2,468,205; 2,616,971; 3,009,991; 4,254,303; and 4,306,115. These patents adjust the sound output level from the speakers to compensate for background noise level. In other words, if there is a high background noise, the gain of the amplifier system is turned up so that the useful sound can be heard over the noise level. As the noise level subsides, there is an automatic reduction of the sound output from the speakers. Another U.S. Pat. No. 4,583,245 discloses a system for protecting the audio output speakers from damage that might be caused by driving a speaker with sound containing frequencies which cause the speaker diaphragm to execute excursions which are greater than the diaphragm was designed to withstand. Thus, in this patent, the input sound spectrum from the microphones is separated into its constituent frequency bands. In this way the frequency for which a particular speaker has been optimized is directed to that speaker so the speaker will not be damaged. The listener's ears reconstitute the sound spectrum which is emitted by the separate speakers.

Up to the time that the invention disclosed herein was made, no one has provided an audio control system which automatically brings about compliance with established standards which set the limits for impulse or instantaneous sound levels and cumulative dosage as well.

SUMMARY OF THE INVENTION

In accordance with the invention the new audio amplification system features automatic instantaneous selective attenuation of frequency bands whose decibel levels exceed levels permitted by the standards and automatic attenuation of all frequencies within a predetermined audible range when the cumulative sound energy or dosage exceeds a predetermined level. According to an illustrative embodiment of the invention, microphones are placed in the area of the listeners for sampling the sound coming from the speakers which impinges on the ears of the listeners. The sound representing signal fed back from the microphones is furnished to a microcontroller which has resident firmware for performing a Fast Fourier Transform (FFT) operation which results in signals whose amplitude levels are representative of the intensities or levels of the frequencies in a series of frequency bands within the audible range. In other words, the sound signals are transformed from the time domain to the frequency domain. This makes it possible to attenuate any frequency band which exceeds a stored limit set by the standards and to provide for integration of the sound levels with respect to time so that the whole spectrum can be attenuated if stored dosage limits are exceeded. In the preferred embodiment, the frequency transformed signals are fed in bursts to a microcomputer which is programmed for controlling the input and output of a group of latches, one latch for each frequency band over which control is to be obtained. By way of example and not limitation, there may be 16 or more of such latches. The microcomputer sequences the various frequencies to the latches and the output of each latch is the input to a notch filter or attenuator that allows any amount of attenuation or no attenuation to the particular frequency band which is assigned to it depending upon whether or not the decibel level is above or below the stored acceptable reference limit. In other words, there are as many notch filters or attenuators as there are frequency bands into which the sound spectrum is being analyzed or divided. In the illustrative embodiment there are 16 notch filters, one associated with each of the latches. The notch filter attenuators are essentially connected in series in the illustrated embodiment and each one is provided with switches for attenuating and deattenuating the particular frequency in steps in response to control signals generated by the microcomputer. Each notch filter has an electronic shunting switch which can be activated to bypass the particular notch filter to which is assigned a particular frequency band assuming that the signal level corresponding to that frequency is below the permissible level or upper limit for that frequency. If all frequency bands in the audio spectrum which is being produced by the performers are not in excess of the stored limits, all of the shunting switches remain in a state which allows bypassing of all the notch filters so that the sound goes out directly to the amplifiers and then to the speakers which present the sound to the audience.

Further in accordance with the invention, an integration unit is provided which functions to integrate and display the accumulative sound dosage. When the cumulative sound dosage is trending toward violating the stored reference limit the whole sound frequency spectrum is attenuated. The system can even shut down the amplifiers and stop output from the speakers when the permissible cumulative dose is exceeded to protect the unwary against permanent hearing loss.

How the foregoing features of the control system are accomplished will be evident in the ensuing description of an illustrative embodiment of the invention which will now be set forth in reference to the drawings.

DESCRIPTION OF A PREFERRED EMBODIMENT

Figure 1:
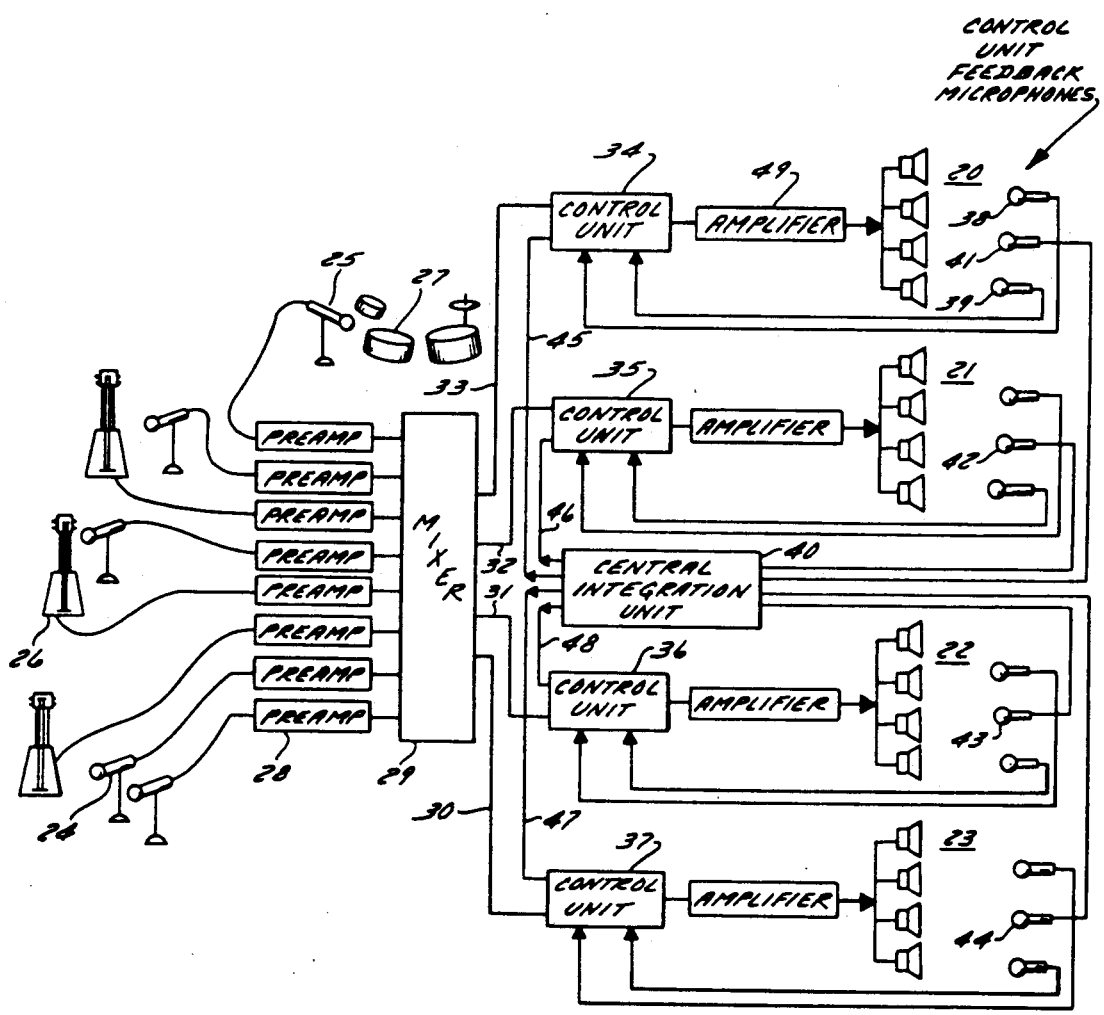
FIG. 1 is a block diagram of an audio system which incorporates the new hearing protection features.

FIG. 1 is a diagram of a typical audio amplification system which may be installed at the site of a concert played by musicians whose work usually has more appeal to young persons than to older persons. Of course, the new hearing protective devices can be used in sound systems other than for amplifying music. The music emitted from speakers at concerts is customarily sufficiently loud to cause temporary and, many times, permanent hearing damage. In the United States, the Occupational Safety and Health Administration (hereafter referred to as OSHA) has established standards for governing the time during which sounds at particular frequencies and decibel levels are permissible. There are also standards for broad spectrum sound levels wherein the time weighted average of the sound level that is permitted varies generally inversely to the decibel level of the sound. Standards have also been set for cumulative sound dosage limits. In the FIG. 1 installation, there are four speaker towers 20, 21, 22, and 23 each of which supports four speakers whose sound output is directed towards listeners, not shown. The sound originates at microphones, such as those marked 24 and 25, which intercept the sound emitted by musical instruments 26 and drums 27. The musicians who play these instruments are exposed to intense sound along with the listening audience. Each microphone which intercepts the sounds of one or more instruments or vocal artists' outputs an analog sound signal to a preamplifier. In this particular example, there are eight preamplifiers which are all the same. An illustrative preamplifier is marked 28. The analog output signals from the preamplifiers are conducted to a mixer 29 which outputs on each of coaxial lines 30-33 a broad spectrum analog signal which is a composite of the sounds produced by the various instruments and vocalists. In accordance with the invention, a control unit is provided for each of the speaker towers. In this particular example, where there are four speaker towers, four control units 34-37 are employed. Microphones such as the two marked 38 and 39 are deployed among the audience for detecting or sampling the sound level which is emitted from the speakers and is being heard by the audience. The time domain analog signals representative of the sound intercepted by microphones 38 and 39 are fed back to control unit 34. As will be explained in detail later, a typical control unit 34 has the capability of analyzing the frequency content of the feedback analog signal which represents the sound output of a group of adjacent speakers. More particularly, the control units 34-37 perform a Fast Fourier Transform operation on the audio signal after it is digitized and converted from the time domain to the frequency domain. In other words, a determination is made as to the intensity of frequencies in a succession of frequency bands encompassing the entire feedback sound spectrum. The control units are provided with the capability of comparing the intensity or level of each frequency band with a stored permissible level for each particular band. As will be elaborated later, each control unit is provided with means for attenuating any frequency band whose analog signal, representing that frequency, exceeds the permissible limits which are set by OSHA and are stored into the control unit. It is only the frequency bands which exceed limits that are attenuated by the control units. If no frequency band exceeds permissible limits, the sound simply goes through to the speakers without attenuation. The output from the control units such as control unit 34 is input to an amplifier 49 which drives the speakers 20 on one of the towers. Control units 35, 36 and 37 function similarly and need not be discussed more extensively at this time.

The new system depicted in FIG. 1 also monitors the cumulative sound dosage to which the listeners in the audience are exposed. If the cumulative sound dose exceeds a stored limit, the whole spectral band will be attenuated automatically. In some cases, in order to comply with the stored OSHA standard for cumulative dose, the speakers may be completely turned off. To achieve this function, the installation in FIG. 1 has a block 40 which is designated a central integration unit. It is provided with the devices, as will be elaborated later, for measuring cumulative dose and for displaying the dose continuously as it is being accumulated. In this particular example, there are four feedback microphones 41-44 which pick up the sound emitted from the speakers and feed back a corresponding analog signal to the central integration unit 40. One of the output lines 45-48 from the central integration unit (CIU) feeds a control signal to the control units for bringing about attenuation of the frequency bands as required for complying with cumulative dose limits of OSHA.

A typical control unit 34 will be discussed in reference to FIG. 2 which is composed of parts 2A and 2B. In the FIG. 1 installation, four such control units are used because four differently aimed speaker groups are used. In some installations more control units may be needed and in others only one control unit may be necessary.

Figure 2A:
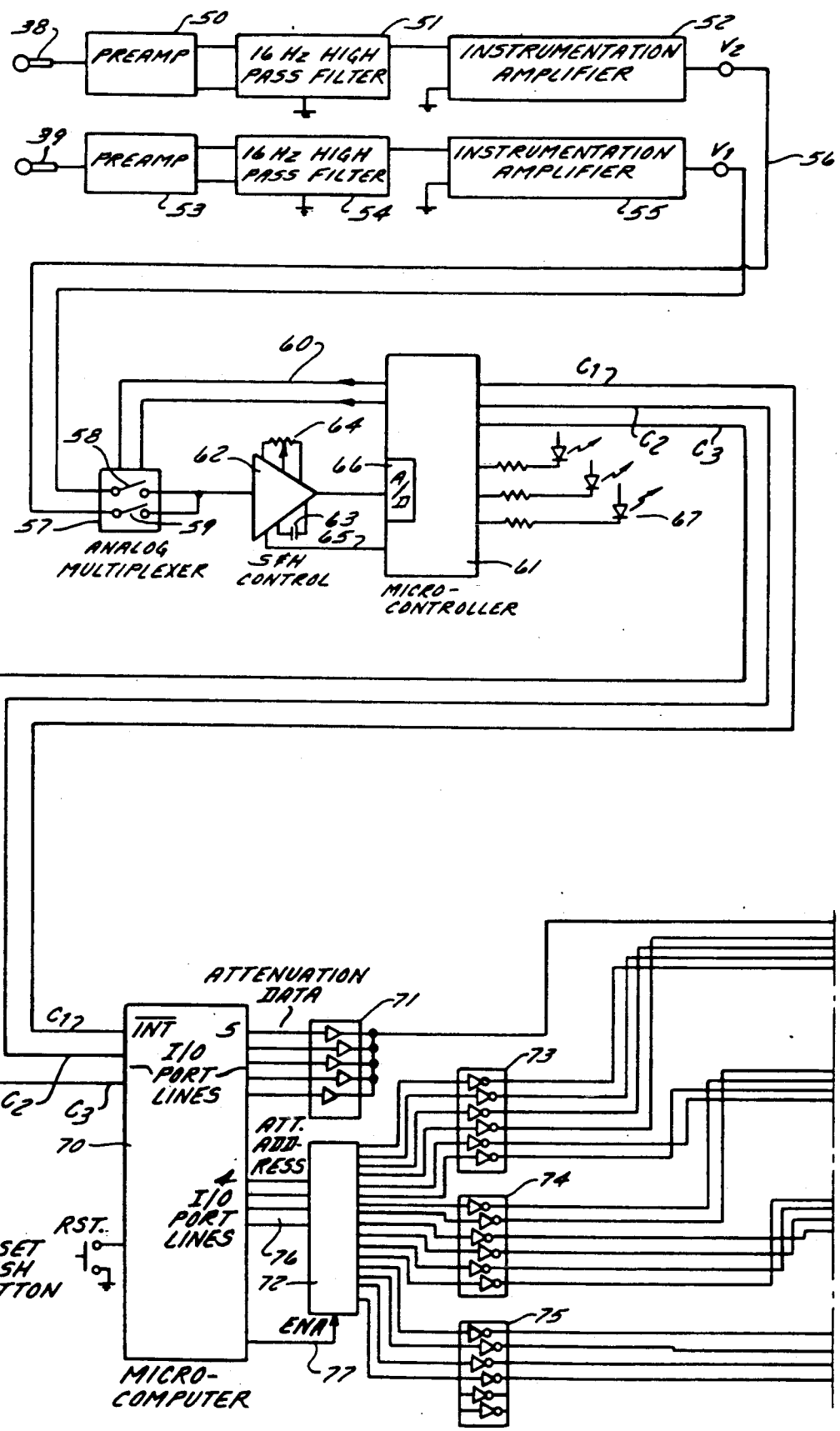
FIG. 2 comprised of parts 2A and 2B, depicts a circuit diagram for one of a plurality of control units for a system which attenuates the sound level on a frequency selective basis.

The feedback microphones 38 and 39 for one control unit are depicted in the upper left portion of FIG. 2A. Microphone 38 detects the full audio output spectrum from the speakers at one tower and supplies the corresponding analog signal to a signal conditioning network comprised of a preamplifier 50, a 16 Hz high pass filter 51 and an instrumentation amplifier 52. These components are of a conventional commercially available type. Audio frequencies below 16 Hz are filtered out because they are below the hearing capability of the human ear. The instrumentation amplifier 52 provides an adjustable offset and adjustable gain signal conditioning operation for proper scaling of the feedback signal. An Analog Devices AD-521 amplifier 52 or equivalent can be used. There is another microphone 39 and a similar signal conditioning network comprised of preamplifier 53, a filter 54 and an instrumentation amplifier 55 which is redundant or on standby for being used in the event the other signal conditioning network becomes inoperative. The full spectrum conditioned analog feedback signal is input by way of a line 56 to an analog multiplexer 57 which is symbolized by a rectangle containing two semiconductor switches 58 and 59. An Intersil IH5208 multiplexer or equivalent may be used. Since only one signal conditioning network is active at a time, only one of the switches 58 or 59 will be operating ordinarily. The analog multiplexer switch 58 is operated by control lines or I/0 port lines 60 leading from a microcontroller 61. After having passed through the analog multiplexer 57, the analog audio signal is input to a sample-and-hold amplifier 62. The time constants of the sample-and-hold amplifier are determined by the value of a capacitor 63 and a potentiometer 64. A Teledyne Philbrick TP 4856 sample-and-hold amplifier has been used successfully but an equivalent amplifier could also be used. The control signal for timing the sample-and-hold amplifier 62 is supplied by the microcontroller 61 over a line 65. The whole analog audio spectrum is sampled continuously.

The output signal from the sample-and-hold amplifier is processed in a signal processing circuit comprised of a microcontroller 61, a microcomputer 70, attenuation data buffer 71, attenuator address decoder/demultiplexer 72, inverting buffers 73, 74, 75, sixteen latches 1-16, and sixteen series connected notch filter attenuators AF1-AF16 each of which has an electronic shunting or bypassing switch. These components compose one of the control units such as any one of control units 34-37 in FIG. 1. Decoder/demultiplexer 72 is a Signetics 74LS154 or equivalent. Attenuator data buffer 71 is a 74LS241 buffer and inverting buffers 73-75 are 74LS240. Microcomputer 70 is a Motarola MC 68705U3. The microcontroller 61 used in an actual embodiment is an Intel 8096 controller but an equivalent controller could be used. This microcontroller has resident firmware which performs a Fast Fourier Transform (FFT) analysis on the conditioned microphone feedback signal to convert the time domain analog signal to discrete frequency domain spectra or in other words, the amplitude of the frequencies in discrete bands making up the frequency domain spectra. In the illustrative embodiment, the conversion is to 16 discrete frequency domain bands. The spectra or bands are periodically transmitted to the attenuator control network by way of serial communication lines C1, C2 and C3. It should be understood that the FFT analysis firmware could be instructed to divide the frequency spectrum into more than 16 frequency bands such as 32 bands if desired. There are some light emitting diodes 67 associated with microcontroller 61 for providing program status indication which is conventional. The microcontroller 61 with firmware for FFT analysis on board and analog-to-digital (A/D) conversion means 66 on board is a commercially available integrated circuit. An actual embodiment of the audio dosage control system uses an Intel 8096 integrated circuit microcontroller which is described in Intel Corporation application note AP-275 in the "Embedded Control Applications Handbook" which bears the copyright date of 1988.

The frequency content output from microcontroller 61 in the signal processing means is input to microcomputer 70 which is the first stage of an attenuator network. The input to microcomputer 70 is a stream of 16 digital values corresponding to the amplitudes of the 16 half-octave FFT spectra. The moment that the FFT analysis microcontroller 61 calculates the frequency spectra values, the microcontroller 61 transmits a high speed burst of spectra values by way of lines C1-C3 and then the lines are dead for an instant until the next burst. The FFT calculation and the output transmission are done at the same time as data are input to microcontroller 61. A real time analysis is conducted. No data are lost. All data coming in from the operative microphone 38 or the standby microphone 39, when used, are subjected to FFT analysis.

Microcomputer 70 has stored in it 16 values which represent the permissible decibel levels or intensities of the 16 different frequency bands. The values preferentially stored are based on the permissible levels set by OSHA. There is a different frequency intensity value for each of the frequency bands. This is because some frequencies have been found to do greater damage to human hearing than other frequencies. Hence, the permissible level limits for the frequencies which are most harmful are lower than the limits for other frequencies. The microcomputer 70 receives the spectra data in serial format from the FFT analysis microcontroller 61. Resident firmware in microcomputer 70 compares individual spectral band levels with permissible impulse levels stored in memory. As will be shown, any spectral band having an amplitude in excess of permissible levels is automatically attenuated or filtered.

Figure 2B:
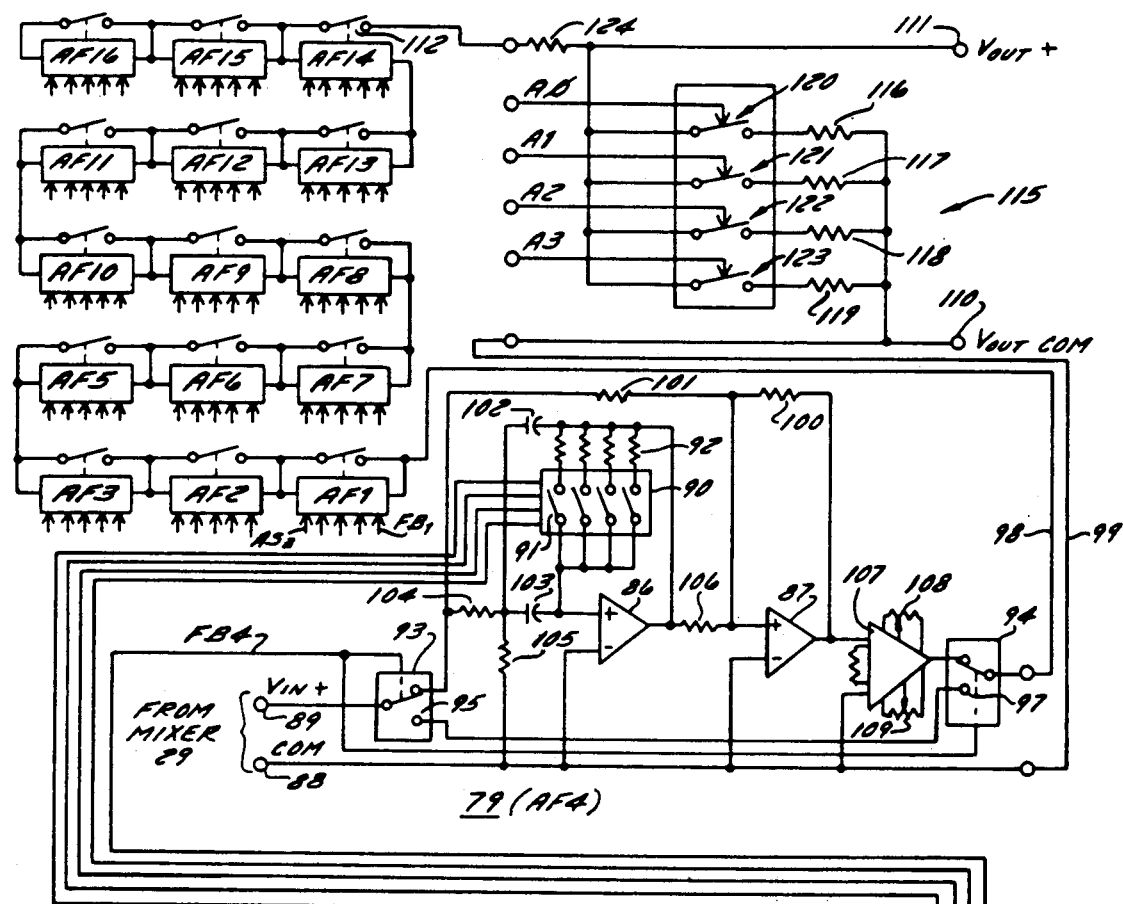

In FIG. 2A, microcomputer 70 makes a comparison with the stored permissible frequency intensity levels within microseconds. The excesses of instantaneous frequency band levels, if any, over stored limits for the respective bands are represented by digital data whose magnitudes correspond to the degree of which the limit exceeding bands should be attenuated to drop them below the limits according to OSHA standards. The attenuation control data are coupled through data buffer 71 to sixteen latches LT1-LT16. There are also three inverting buffers 73, 74 and 75. Microcomputer 70 outputs addresses on four lines 76. These addresses are input to decoder/demultiplexer (Demux) 72. When the Demux is enabled by means of a signal on line 77, the latches LT1-LT16 in FIG. 2B are addressed. Each of the latches handles the control data for one frequency band. There are 16 address lines leading out of inverting buffers 73-75. The 16 address lines are connected to the 16 latches so attenuator control data can be addressed to the latches for the individual frequency bands. Five bits of data are available. The data are transmitted by way of a five bit parallel bus 78 to any of the attenuators AF-1-AF16 which is being addressed. The data coupled through buffer 71 are indicative of the amount which any particular frequency band must be attenuated to bring its intensity or level below the stored permissible limit for that frequency. As shown in part B of FIG. 2, five bit data are transmissible to the latches as they are addressed by way of buses 79, 80, 81 and 82. The digital data values are indicative of the amount by which a particular frequency should be attenuated to bring it down to the permissible limit, provided the intensity of that frequency exceeds the limit at the moment. For that purpose, notch filter attenuators such as the one indicated generally by the reference numeral 83 are provided. In part B of FIG. 2, only one of the notch filter attenuators 83 (AF4) is depicted in detail and it is the one controlled by data which is output from latch LT4. The other notch filter attenuators AF1-AF3 and AF-4-AF16 are depicted in block form since they are similar to ASF5 and are connected in series. However, each attenuator is provided with bypassing or shunting switch means such as two switches 93 and 94 in attenuator AF4 and the one symbolic switch means such as the one marked 112 on AF14. The analog audio signal from the mixer 29 in FIG. 1 is input to terminals 88 and 89 of the first attenuator AF4 in the series on its way to a speaker. Frequency bands which need no attenuation simply bypass the filter for the particular band assigned to it by rendering the electronic bypass or shunting switch means conductive means as will be elaborated. Each control unit among the control units 34-37 depicted in FIG. 1 contains the 16 latches LT1-LT16 and a corresponding number of attenuators or notch filters AF1-AF16. Each one of the attenuators or filters is tuned for attenuating a particular frequency band among the 16 bands. Attenuation of a particular frequency is initiated by addressing the latch which is assigned to that frequency for controlling an individual attenuation filter by way of the decoder/demultiplexer 72 and then the attenuation and enabling code for controlling the amount of attenuation by the filter such as 83 or AF4 is placed on the attenuator data bus 78, thereby strobing the respective latch in the attenuator latch network. The attenuator is progressively removed over a variable time period for reset as the excessive frequency subsides. The attenuation filter network is comprised of programmable active second-order notch filters AF1-AF16, using conventional dual operational amplifiers 86 and 87. As previously indicated, the composite untransformed audio signal produced by the musical instruments, for example, is supplied from mixer 29 in FIG. 1 to the input terminals 88 and 89 of each of the notch filters. The notch filters filter out all frequencies above and below the frequency band to which they are tuned. In this way it is possible to eliminate or attenuate the selected frequency band among the bands that are fed into input terminals 88 and 89 of each of the 16 notch filters AF1-AF16 in a control unit. In order to avoid noticeable changes in musical sound when a frequency is to be attenuated, attenuation is done in steps by means of an integrated circuit analog switch device 90 which is symbolized in typical frequency band attenuation filter AF4 by four mechanical switches 91 connected in series with resistors such as the one marked 92. The attenuation control resistors 92 are switched in and out by analog switch device 90 which may be an Intersil DG211CJ or equivalent. The two symbolized single pole double throw solid state analog bypass or shunting switches 93 and 94 in typical attenuation filter AF4 are controlled by a signal on line FB4 to switch the audio input signal to analog switch 93 from the position shown to terminal 95 of the switch and to line 96 which leads to a terminal 97 in the other analog switch 94. The two switches are operated simultaneously by the signal on line FB4 at any time that they should be operated. The time when they are switched closed is when the particular frequency to which the notch filter is tuned is at a level or intensity below permissible limits in which case no attenuation is necessary. When that is the case, the audio signal bypasses the notch filter. If it is necessary to attenuate the particular frequency band, the signals on the lines AS0 to AS3 from illustrative latch LT4 are supplied progressively to analog switch 90 in the notch filter 83 (AF4) at a rate faster than the human ear can detect the change in the intensity or level of the frequencies to which the respective notch filters are tuned. The notch filters are essentially conventional and contain feedback resistors 100 and 101, coupling capacitors 102 and 103, a divider circuit comprised of resistors 104 and 105 and input resistor 106 and an instrumentation amplifier 107. This amplifier may be an Analog Devices AD521 or equivalent. Filter offset and gain adjustments are obtained by way of potentiometers 108 and 109, respectively.

The output lines 98 and 99 from each notch filter lead to output terminals 110 and 111 which are connected to the inputs of amplifiers such as the one marked 49 in FIG. 1 which takes the signal from control unit 34 in that figure and supplies it to the four speakers 20 on one of the speaker towers.

Thus far, the manner in which individual frequency bands are attenuated in each control unit has been described. Attenuation in steps, when required, occurs in microseconds and is imperceptible to the listeners. Similarly, when the intensity or amplitude of a particular frequency drops to below stored acceptable limits attenuation is removed in steps. Whenever one of the bands is in excess of the permissible limit, the computer 70 in part 2A of FIG. 2 sets some software switches. The software starts special scan routines which watch the effectiveness of the attenuation versus feedback from the pick up microphone 38 or 39, depending upon which one is active. The computer initially applies about 25% of the filter attenuation. If that is insufficient to drop below the permissible limit, the computer continues to apply more and more attenuation. For example, assume that the instantaneous limit for some frequency band is 113 decibels and is far above the 95 decibels which may be allowed by OSHA for the particular frequency. The computer would turn on the first four analog switches 91 in switching circuit 90 and after the time delay for feedback about 109 decibels for that frequency might be detected. The computer will not start to turn off the attenuator because, obviously, if the input is the same the attenuator will come right back up again. So it will demand that the level drop down to 107 decibels for instance, before it starts to remove attenuation. In an illustrative embodiment, the step down is at the rate of 25% and 5% over several seconds. Attenuation is decreased slowly. But at any point when reducing attenuation, the signal at the frequency goes to the limit again, the computer increases attenuation again.

The loop responds faster than the ear can detect. If the engineer running the mixer and amplifiers of the audio systems suddenly turned up the gain, the audience would not hear a damaging sound level. The first part of the waveform will come out of the speaker tower but before the waveform is complete at that frequency the attenuation will bring the frequency way down within 10 microseconds.

Figure 2B:
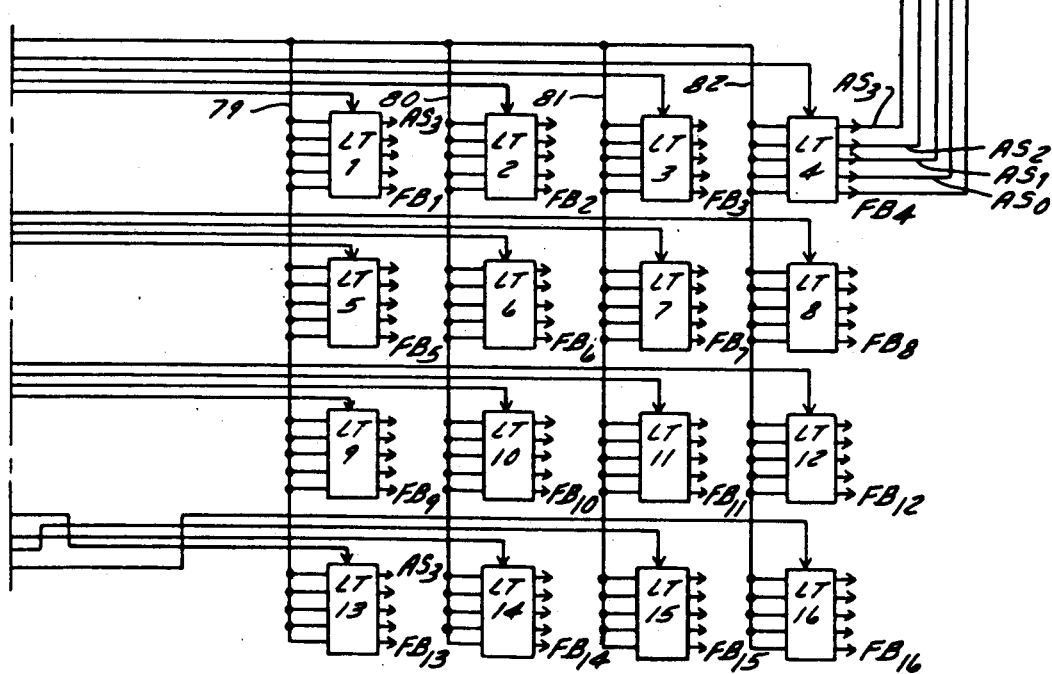

In part 2B of FIG. 2 there is another switching and resistor network indicated generally by the reference numeral 115. This network is involved in controlling and limiting the permissible cumulative sound dose over a given period of time as will now be explained in reference to FIG. 3.

Figure 3:
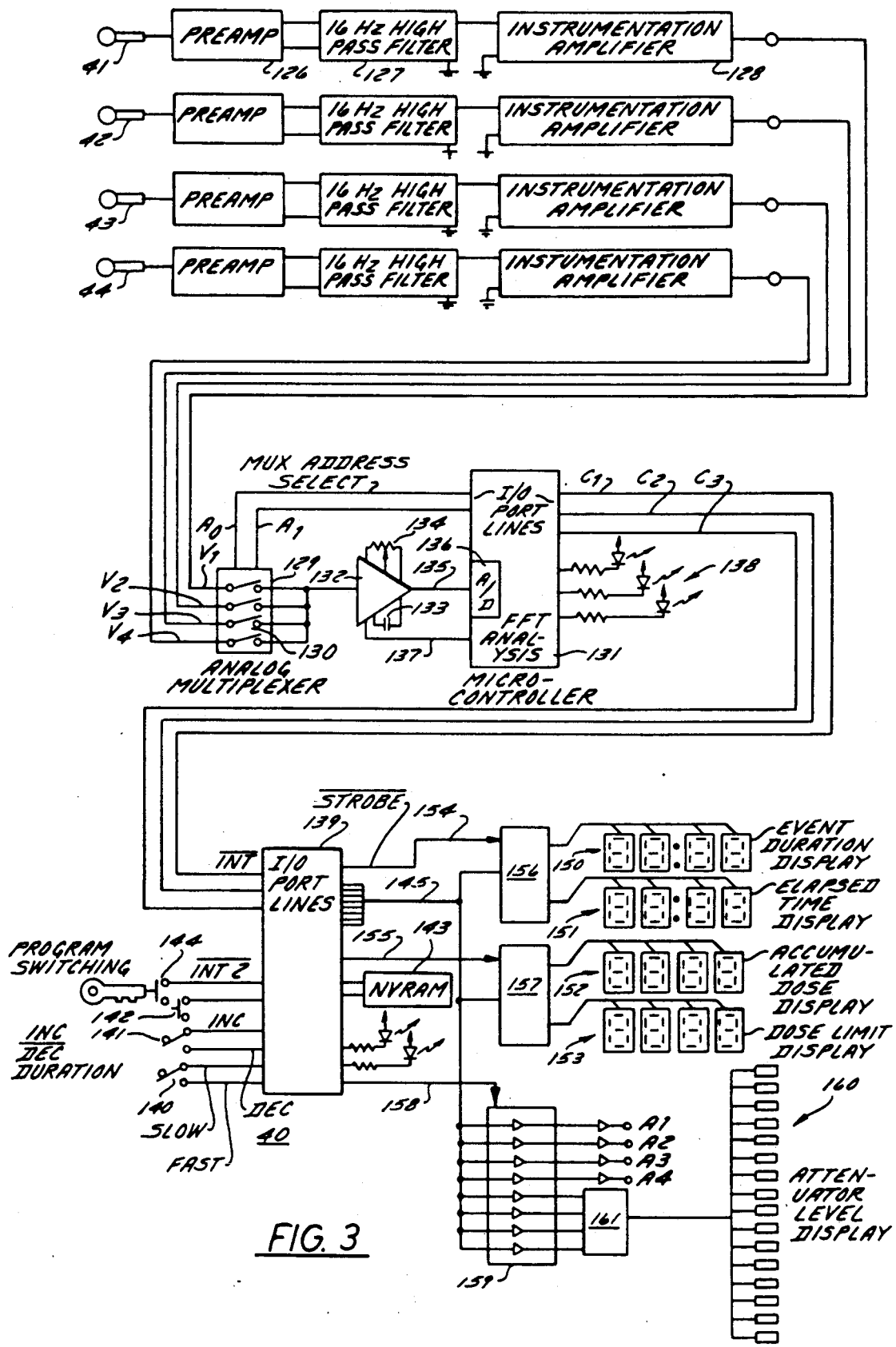
FIG. 3 is a block diagram of the integration circuitry of the system which prevents excess sound dosage from impinging on the ears of listeners.

FIG. 3 shows the central integration unit 40 which is represented by the similarly labeled block 40 in the system diagram of FIG. 1. In FIG. 3, the pickup microphones 41-44 depicted in FIG. 1 are repeated. In this embodiment there is one such microphone for each one of the speaker groups 20-23. Each microphone provides an analog signal representative of the sound it takes up from the speakers to respective signal conditioning systems comprised of a preamplifier 126, a high pass filter 127 and an instrumentation amplifier 128. These four systems are all the same and are basically the same as the signal condition systems at the top of FIG. 2A. Typical microphone 41, for example, provides an analog input signal to preamplifier 126 whose output is fed to a 16 Hz high pass filter 127 whose output constitutes the input to an instrumentation amplifier 128. The four conditioning circuits all receive audio signals from sound sampling feedback microphones 41-44. The substantially similar four analog signals from the conditioning circuits are fed by way of lines V1-V4 to the inputs of an analog multiplexer (MUX) 129 which may be an Intersil IH5208 or equivalent. MUX 129 contains four solid state switches which are typified by the one marked 130. A microcontroller 131 addresses the individual switches of MUX 130 by way of address select lines A0 and A1. The analog signals originating with the microphones are sequenced through the MUX 129 and are input to a sample-and-hold amplifier 132 which may be a Teledyne Philbrick TP4856 or equivalent. The time constants or sampling rate of the sample-and-hold amplifier 131 is governed by a capacitor 133 and a potentiometer 134.

Microcontroller 131 is similar in structure and function to microcontroller 61 in the FIG. 2 control unit. As in the previous case, microcontroller 131 performs a Fast Fourier Transform (FFT) analysis on the conditioned microphone feedback signals to convert the time domain analog signals to discrete frequency domain spectral bands. Microcontroller 131 may be an Intel 8096 or equivalent. The analog input signals to microcontroller 131 are converted for processing to digital signals as suggested by the block having the letters A/D and marked 136. The microcontroller 131 controls the sampling rate of the sample-and-hold device 132 by signals transmitted over line 137. A group of light emitting diodes and limiting resistors 138 provide program status indication of the microcontroller.

The output serial communication lines C1-C3 leading from the central integration unit transmit the transformed frequency spectra to the input of a microcomputer 139 similarly to what is happening in each control unit as was explained. A Motorola MC68705U3 microcomputer 139 or equivalent is being used. By feeding the central integration unit 40 from four microphones 41-44, an average sound level over the listener area is obtained rather than from a single spot. The four microphones also provide for redundancy. If one fails or is vandalized, the software in microcontroller 131 switches that speaker out by keeping the appropriate switch in MUX 129 open.

Microcomputer 139 compiles a running sum or integration of equivalent dose for each frequency bandwidth. Weighting factors are stored in memory which is on board the computer. The computer accesses a weighting factor for each bandwidth from internal memory. It multiplies the bandwidth by an individual weighting factor because the relative damage to hearing of particular frequencies is different. The weighted doses are summed and stored in a register on board the computer as integrated dose.

Event duration and initiation control are programmed into microcomputer 139 using switches 140, 141 and 142. The dosage is continually stored in a nonvolatile RAM memory chip (NVRAM) 143. This may be a Dallas Semiconductors DS1220Y memory or equivalent. To prohibit unauthorized adjustment of total allowable dose, a key operated switch 144 is provided. Memory 143, being non-volatile, will maintain accumulated dose in storage for any length of time so if there is a power failure during an audio event, the memory will begin adding to the cumulative dose where it had stopped at the time of the power failure when the power is restored.

An eight bit data bus 145 is output from microcomputer 139. This data bus provides signals for controlling digital displays. One group of displays 150 show the predetermined duration of the event which is entered for display by using switches 140 and 141. Another group of displays 151 show the amount of time that has elapsed since the beginning of the concert or other audio event. Another group 152 of displays is continuously updated during the event to display the cumulative dose up to the present moment. Another group 153 of displays exhibits a cumulative sound dose limit which is permissible for the predetermined event duration. Signals by way of lines 154 and 155 strobe display decoders 156 and 157. Another line 158 strobes a latch chip 159 which may be an Intersil 74LS373 to update attenuator level displays 160. A decoder 161 controls the bar graph displays.

The computer 139 program is essentially a software expression of OSHA dose standards. The standards allow specified numbers of equivalent decibel hours or time weighted averages (TWA) for various frequencies and for the sound spectra as a whole. As the permissible time weighted averages are approaching their predictive limits it is necessary to increase attenuation in all of the control units 34-37 or any other quantity of control units in the system to stay within limits for the programmed event duration. If the time weighted averages are used up before the scheduled end of the event it is necessary to shut down the audio amplification system completely to comply with programmed OSHA total sound dosage for corresponding event duration.

The attenuator control signals for controlling the degree of overall sound volume reduction or even shut down of the audio amplification system appear on terminals A0-A3 in the lower right region of FIG. 3. Cables such as those marked 45-47 in FIG. 1 conduct these signals from the central integration unit 40 to each of the control units 34–37 wherein the control signals are coupled to corresponding terminals A1–A4 in a second attenuator means in each control unit such as the attenuator or volume control 115 in part B of FIG. 2B. The attenuator or volume control circuit 115 is a solid state switch circuit symbolized by resistors 116–119 in series with mechanical switches 120–123, respectively. A four-pole solid state switch such as an Intersil DG211CJ or equivalent has been used in an actual embodiment. The network 115 provides overall full bandwidth attenuation of the audio output signals leading to output terminals 110 and 111 by selective switching of attenuation resistors in conjunction with a dropping resistor 124 in response to attenuation code signals which are input to control signal terminals A0–A3.

I claim:

1. An audio system wherein generated sound is emitted from a speaker for being heard by a listener and the system is adapted for controlling the sound dosage to which said listener is exposed, comprising:

means for producing a first signal representative of a generated sound spectrum whose amplitude varies with time, means for producing a feedback signal representative of the sound spectrum emitted by said speaker and of sound existing in the environment of the speaker, the amplitude of said signal varying with time, signal processing means having input means for said feedback signal and having output means, said processing means including means operative to produce data representative of the levels of particular frequency spectral bands contained in the sound spectrum emitted by said speaker and sound sources in the environment of the means for producing said feedback signal and to compare the produced data with stored data representative of standard levels of the respective particular spectral bands which it is permissible for the listener to hear and to produce attenuation control signals respectively corresponding to the amounts by which the values of the produced data exceed the values of said stored data, a plurality of first attenuating means respectively for attenuating particular frequency bands, said attenuating means having input means for said first signal representative of said generated sound spectrum and having output means, said means for attenuating particular frequency bands each having control means for responding to input of an attenuation control signal corresponding to the particular frequency band in the first signal which the particular means for attenuating attenuates by attenuating said frequency band in said first signal for maintaining the dose of each frequency band to no greater than the permissible level, and means for coupling said output means of said means for attenuating to said speaker.

2. The system according to claim 1 wherein said means operative to produce data representative of the levels of the particular frequency bands in said emitted sound spectrum comprise means for transforming said feedback signal from the time domain to the frequency domain.

3. The system according to claim 2 wherein said means for transforming are Fast Fourier Transform means.

4. The system according to claim 1 wherein said plurality of means for attenuating particular frequency bands are series connected notch filters each of which is adapted to attenuate a particular frequency band and to pass frequencies substantially above and below said particular frequency band, said series of notch filters each having said input means for said first signal which is representative of said generated sound spectrum and the last of said notch filters in said series having the output means which are coupled by said means for coupling said means for attenuating to said speaker, circuit means including switch means connected in shunt with said means for attenuating, respectively, said switch means responding to control signals from said signal processing means which are indicative of frequency bands not exceeding said permissible stored levels by causing said switch means to conduct so said first signal bypasses the means for attenuating without that frequency being attenuated.

5. An audio system wherein generated sound is emitted from a speaker for being heard by a listener and the system is adapted for controlling the sound dosage to which said listener is exposed, comprising:

means for producing a first signal representative of a generated sound spectrum whose amplitude varies with time, means for producing a feedback signal representative of the sound spectrum emitted by said speaker and of sound existing in the environment of the speaker, the amplitude of said signal varying with time, signal processing means having input means for said feedback signal and having output means, said processing means including means operative to produce data representative of the levels of particular frequency spectral bands contained in the sound spectrum emitted by said speaker and sound sources in the environment of the means for producing said feedback signal and to compare the produced data with stored data representative of standard levels of the respective particular spectral bands which it is permissible for the listener to hear and to produce attenuation control signals respectively corresponding to the amounts by which the values of the produced data exceed the values of said stored data, a plurality of first attenuating means respectively for attenuating particular frequency bands, said attenuating means having input means for said first signal representative of said generated sound spectrum and having output means, said means for attenuating particular frequency bands each having control means for responding to input of an attenuation control signal corresponding to the particular frequency band in the first analog signal which the particular means for attenuating attenuates by attenuating said frequency band in said first generated signal for maintaining the dose of each frequency band to no greater than the permissible level, means for coupling said output means of said means for attenuating to said speaker, means for determining the cumulative sound dose to which a listener would be exposed during a predetermined time of exposure comprising:

means for producing a second feedback signal representative of the sound emitted by said speaker, the amplitude of the signal varying with time, second signal processing means having input means for said second feedback signal and having output means, said processing means operative to produce continuously data representative of the levels of individual frequency bands contained in the emitted sound and to integrate or keep a running sum of equivalent dose for each frequency band, said processing means being further operative to multiply the integrated dose of each frequency band by stored weighting factors which weight the frequency bands according to their tolerance by human hearing relative to exposure time and to sum the weighted results to produce data representative of time weighted cumulative dose for all frequency bands and to compare said data with stored permissible cumulative dose limits, said processing means responding to the results of said comparison by producing second attenuation control signals on said output means representative of the degree by which the signal driving the speaker must be attenuated to hold the dose rate at a level which will prevent cumulative overdose during said predetermined time of exposure, and second attenuating means and means coupling said second attenuating means to said speaker, said second attenuating means having control signal input means to which said second attenuation control signals are coupled for effecting attenuation of the time varying signal to said speaker when said cumulative dose exceeds the permissible limit.

6. The system according to claim 5 including non-volatile memory means to which data representative of said cumulative sound dosages is addressed by said second signal processing means as the data are produced for said second processing means to have access to said data to provide for continued integration of said dose when emission of sound from said speaker is restored after it has been interrupted during the event at which said sound is generated.

7. The system according to claim 5 including means controlled by said second processing means for displaying the level of cumulative sound dose as said dose is accumulated.

8. The system according to claim 5 including means controlled by said second signal processing means for displaying the permissible dose limit for the predetermined length of time of the event at which the sound is emitted.

9. An audio system adapted for limiting levels of frequency bands in time variable sound emitted by a speaker and heard by a listener to protect the listener from hearing damage due to excessive sound levels within a predetermined time interval, comprising;

means for producing a time varying first signal representative of sound generated by a source, means having input means for said signal and output means for coupling said signal to said speaker for driving the speaker, means for producing a feedback signal representative of the time variable sound emitted from said speaker and of time variable sound generated in the environment of the listener, controller means having input and output means, said feedback signal being coupled to the input means and said controller means being operative to transform said feedback signal into frequency bands whose respective magnitudes represent the frequency content of the signal, means for comparing having input means to which said frequency bands are coupled for being compared with stored data representative of the respective permissible reference frequency band levels and for producing control signals corresponding, respectively, to the amounts by which the compared frequency bands levels differ from the reference frequency band levels, a plurality of first signal attenuator means having output means and having input means for said time varying first signal and input means to which said control signals are coupled for controlling said attenuator means to attenuate frequencies in said first signal which are above said permissible levels, and means for coupling said output means of the attenuator means to said speaker.

10. The system according to claim 9 wherein said controller means includes Fast Fourier Transform means which transform said feedback signals into frequency bands whose magnitudes represent the frequency content of said feedback signal.

11. The system according to claim 9 wherein said attenuator means are notch filters each of which is adapted for passing one of the frequency bands, said means in each notch filter for controlling said notch filters being adapted to attenuate a frequency band in steps in response to a control signal indicative of the frequency bands for the filter exceeding a permissible limit.

12. An audio system adapted for limiting levels of frequency bands in time variable sound emitted by a speaker and heard by a listener to protect the listener from hearing damage due to excessive sound levels within a predetermined time interval, comprising:

means for producing a time varying first signal representative of sound generated by a source, means having input means for said signal and output means for coupling said signal to said speaker for driving the speaker, means for producing a feedback signal representative of the time variable sound emitted from said speaker and of time variable sound generated in the environment of the listener, controller means having input and output means, said feedback signal being coupled to the input means and said controller means being operative to transform said feedback signal into frequency bands whose respective magnitudes represent the frequency content of the signal, means for comparing having input means to which said frequency bands are coupled for being compared with stored data representative of the respective permissible reference frequency band levels and for producing control signals corresponding, respectively, to the amounts by which the compared frequency bands levels differ from the reference frequency band levels, a plurality of first signal attenuator means having output means and having input means for said time varying first signal and input means to which said control signals are coupled for controlling said attenuator means to attenuate frequencies in said first signal which are above said permissible levels, means for coupling said output means of the attenuator means to said speaker, means for determining the cumulative sound dose to which the listener will be exposed during a predetermined exposure time, comprising:

means for producing a second feedback signal representative of the sound emitted by the speaker and of sound generated in the environment of the listener, the amplitude of the signal varying with time, second controller means having input and output means, said second feedback signal being coupled to the input means and processed by said second controller means to result in data representative of the levels of the individual frequency bands contained in the emitted sound and to integrate or continuously sum the equivalent dose for each frequency band, said second controller means further operative to multiply the integrated dose of each frequency band by stored weighting factors which weight the frequency bands according to their tolerance by human hearing relative to exposure time and to sum the weighted results to produce data representative of time weighted cumulative dose for all frequency bands and to compare said data with stored data corresponding to permissible time weighted dose limits, said second controller means responding to the results of said comparison by providing second attenuation control signals on said second controller output means which correspond to the amount by which the signal driving the speaker must be attenuated to keep the dose rate at a level which prevents an overdose during the time of exposure, and second attenuator means and means coupling said second attenuator means to said speaker, said second attenuator means having control signal input means to which said second attenuation control signals are coupled for attenuating the time varying signal coupled to said speaker when said cumulative dose exceeds the permissible limit.

13. The system according to claim 12 including nonvolatile memory means to which data representative of said cumulative sound dosages is addressed by said second signal processing means as the data are produced for said second processing means to have access to said data to provide for continued integration of said dose when emission of sound from said speaker is restored after it has been interrupted during the event at which said sound is generated.

14. The system according to claim 12 including means controlled by said second processing means for displaying the level of cumulative sound dose as said dose is accumulated.

15. The system according to claim 12 including means controlled by said second signal processing means for displaying the permissible dose limit for the predetermined length of time of the event at which the sound is emitted.

16. An audio system adapted for instantaneous control over the frequency content of an analog audio signal which is driving a speaker to emit sound in the environment of a listener, comprising:

means for producing said audio signal representative of sound generated by a source, means for producing a feedback signal in the time domain representative of the sound emitted by said speaker and of sound generated in the environment of the listener, microcontroller means having input means for said feedback signal and having output means, and firmware for controlling said microcontroller means to perform a Fast Fourier Transform on the signal to transform said signal from the time domain to the frequency domain wherein variations in the amplitude of the resulting signal represent the instantaneous levels of the frequency bands composing the feedback signal, computer means having input means coupled to said microcontroller output means and having output means, said computer means operative to compare the levels of said frequency bands in said resulting signal with stored levels representing the permissible levels of the respective frequency bands and to produce control signals corresponding to the amounts by which the frequency band levels differ from the stored levels, a plurality of filter means to provide for attenuating each frequency band, said filter means having input means for said audio signal and having output means for the audio signal, said filter means also having controllable switch means operable in response to input of said control signals to effect attenuation by said filter means of those frequency bands in the audio signal whose levels exceed said permissible levels, and means for coupling said audio signal output means of said filter means to said speaker.

17. The system according to claim 16 wherein said filter means are connected in series, said controllable switch means are connected in shunt between the input and output of each filter means, said controllable switch means operating, respectively, in response to a control signal which corresponds to the frequency band of the filter which the controllable switch means shunts being below the reference frequency level by causing said switch means to conduct and by-pass the audio signal around the filter.

18. The system according to claim 16 including a sample-and-hold means interposed between said means for producing a feedback signal and said input means for said microcontroller means.

19. The system according to claim 16 including latch means corresponding in number to the number of filter means used to attenuate frequency bands in the system, said latch means having input means coupled to said computer means for receiving said control signals and output means coupled to said controllable switch means, and a plurality of address lines for coupling said latch means to said computer means for controlling said latch means, respectively, to transmit said control signals to said filter means.

20. An audio system adapted for instantaneous control over the frequency content of an analog audio signal which is driving a speaker to emit sound in the environment of a listener, comprising:

means for producing said audio signal representative of sound generated by a source, means for producing a feedback signal in the time domain representative of the sound emitted by said speaker and of sound generated in the environment of the listener, microcontroller means having input means for said feedback signal and having output means, and firmware for controlling said microcontroller means to perform a Fast Fourier Transform on the feedback signal to transform said signal from the time domain to the frequency domain wherein variations in the amplitude of the resulting signal represent the instantaneous levels of the frequency bands composing the feedback signal, computer means having input means coupled to said microcontroller output means and having output means, said computer means operative to compare the levels of said frequency bands in said resulting signal with stored levels representing the permissible levels of the respective frequency bands for the listener to hear and to produce control signals corresponding to the amounts by which the frequency band levels differ from the stored levels, a plurality of filter means to provide for attenuating such frequency band which exceeds the corresponding stored level, said filter means having input means for said audio signal and having output means for the audio signal, said filter means also having controllable switch means operable in response to input of said control signals to effect attenuation by said filter means of those frequency bands in the audio signal whose levels exceed said permissible levels, means for coupling said audio signal output means of said filter means to said speaker, including means for determining the cumulative sound dose to which a listener to the speaker would be exposed during a predetermined time of exposure comprising:

means for producing an analog second feedback signal in the time domain corresponding to the sound emitted by the speaker and sound generated in the environment of the listener, a second microcontroller having input means for said second feedback signal and having output means, and firmware for controlling said second microcontroller to perform a Fast Fourier Transform on a digitized version of said second feedback signal to transform it from the time domain to the frequency domain wherein variations int he value of the resultant signal represent the instantaneous levels of the frequency bands which compose the second feedback signal, second computer means having input means coupled to the output means of the second microcontroller and having output means, said second computer means operative to compare data representative of the frequency bands in said resultant signal with stored data representative of the respective permissible levels or dose for the individual frequency bands, said second computer means further operative to integrate the dose for each frequency band and keep a running sum of each frequency band and operative to multiply the integrated dose for each frequency band by stored weighting factors which weight the frequency bands according to their tolerance by human hearing relative to exposure time and to sum the weighted results to produce data representative of the time weighted cumulative dose for all frequency bands and to compare said data with data corresponding to permissible dose limits to produce a second comparison signal, said second computer means responding to the results of said second comparison signal by producing second control signals representative of the degree by which the audio signal driving the speaker must be attenuated to hold the dose rate at a level which will prevent said overdose during said predetermined time of exposure, and second attenuator means and means coupling said second attenuator means to said speaker, said second attenuator means having input means o which said second control signals are coupled for effecting attenuation of said audio signal driving said speaker when the cumulative dose exceeds the permissible cumulative dose limit.

21. The system according to claim 20 including nonvolatile memory means to which said data representative of said integrated sound dosage is addressed by said second computer means and stored as the data are produced for said second computer means to have access to said data to provide for continued integration of said dose when emission of sound from said speaker is restored after it has been interrupted during the event at which said sound is generated.

22. The system according to claim 20 including means controlled by said second computer means for displaying the level of cumulative sound dose as the dose is accumulated.

23. The system according to claim 20 including means controlled by said second computer means for displaying the permissible dose limit for the predetermined length of time of the event at which the sound is emitted.

* * * * *